(12) United States Patent
Kamiyama et al.

(10) Patent No.: US 7,491,342 B2
(45) Date of Patent: Feb. 17, 2009

(54) BONDED SEMICONDUCTOR SUBSTRATE MANUFACTURING METHOD THEREOF

(75) Inventors: Eiji Kamiyama, Tokyo (JP); Takeo Katoh, Tokyo (JP); Jea Gun Park, Seoul (KR)

(73) Assignees: Sumco Corporation, Tokyo (JP); Industry-University Cooperation Foundation, Hanyang University, Seoul (KR)

( * ) Notice: Subject to any disclaimer, the term of this patent is extended or adjusted under 35 U.S.C. 154(b) by 68 days.

(21) Appl. No.: 10/550,761

(22) PCT Filed: Apr. 2, 2004

(86) PCT No.: PCT/JP2004/004886

§ 371 (c)(1),
(2), (4) Date: Jan. 9, 2006

(87) PCT Pub. No.: WO2004/090986

PCT Pub. Date: Oct. 21, 2004

(65) Prior Publication Data

US 2006/0118935 A1    Jun. 8, 2006

(30) Foreign Application Priority Data

Apr. 2, 2003    (JP) ............................. 2003-099541

(51) Int. Cl.
*B44C 1/22*    (2006.01)
*C03C 15/00*   (2006.01)
*C03C 25/68*   (2006.01)
*H01L 21/30*   (2006.01)
*H01L 21/46*   (2006.01)

(52) U.S. Cl. ..................... 216/36; 216/84; 438/458; 438/459; 438/690

(58) Field of Classification Search .......... 216/36, 216/84; 438/455, 458, 459, 690
See application file for complete search history.

(56) References Cited

U.S. PATENT DOCUMENTS 5,374,564 A    12/1994    Bruel .................... 437/24

(Continued)

FOREIGN PATENT DOCUMENTS

EP    0 905 767 A1    3/1999

(Continued)

OTHER PUBLICATIONS

Auberton-Hervé, A.J. et al., "SMART-CUT®: The Basic Fabrication Process for UNIBOND® SOI Wafers," *IEICE Trans Electron*, vol. E80 C, No. 3, 1997, pp. 358-363.

(Continued)

*Primary Examiner*—Roberts Culbert
(74) *Attorney, Agent, or Firm*—Kubovcik & Kubovcik (57) ABSTRACT

The present invention provides a bonded substrate fabricated to have its final active layer thickness of 200 nm or lower by performing the etching by only 1 nm to 1 μm with a solution having an etching effect on a surface of an active layer of a bonded substrate which has been prepared by bonding two substrates after one of them having been ion-implanted and then cleaving off a portion thereof by heat treatment. SC-1 solution is used for performing the etching. A polishing, a hydrogen annealing and a sacrificial oxidation may be respectively applied to the active layer before and/or after the etching. The film thickness of this active layer can be made uniform over the entire surface area and the surface roughness of the active layer can be reduced as well.

6 Claims, 5 Drawing Sheets

U.S. PATENT DOCUMENTS

| | | | |
|---|---|---|---|
| 5,882,987 A | 3/1999 | Srikrishnan | 438/458 |
| 6,020,252 A | 2/2000 | Aspar et al. | 438/458 |
| 6,140,210 A | 10/2000 | Aga et al. | 438/458 |
| 6,323,108 B1 | 11/2001 | Kub et al. | 438/458 |
| 6,372,609 B1 | 4/2002 | Aga et al. | 438/459 |

FOREIGN PATENT DOCUMENTS

| | | |
|---|---|---|
| EP | 1 045 448 A1 | 10/2000 |
| EP | 1 085 562 A2 | 3/2001 |
| JP | 03219000 A  * | 9/1991 |
| JP | 11-102848 A | 4/1999 |
| JP | 11-121377 A | 4/1999 |
| JP | 2000-124092 A | 4/2000 |
| JP | 2003-17723 A | 1/2003 |
| JP | 2004-80035 A | 3/2004 |

OTHER PUBLICATIONS

Tong, Q.Y. et al., "SemiConductor Wafer Bonding: Science and Technology"; Nov. 1998:printout of website http://www3.interscience.wiley.com:8100/WileyCDA/WileyTitle/productCd-0471574813,descCd-description.html?print=true.

* cited by examiner

BONDED SEMICONDUCTOR SUBSTRATE MANUFACTURING METHOD THEREOF

This application is a 371 of international application PCT/JP2004/004886, which claims priority based on Japanese patent application No. 2003-099541 filed Apr. 2, 2003, which is incorporated herein by reference.

FIELD OF THE INVENTION

The present invention relates to a bonded semiconductor substrate and a manufacturing method thereof, and more particularly to such a bonded semiconductor substrate and a manufacturing method thereof that comprises an active layer formed by cleaving and separating a portion of an active layer substrate, specifically the semiconductor substrate having an uniform thickness of the active layer across an entire surface thereof without inducing any peel-off of the active layer, even if the active layer of thin film has the thickness as thin as 0.2 µm or lower.

DESCRIPTION OF THE PRIOR ART

The bonded semiconductor substrate has been broadly studied, especially in the field of semiconductors, from the viewpoint of its feature created by bonding together a support substrate and an active layer substrate having a different property from the support substrate so as to allow the finished bonded semiconductor substrate to have a specific property that is different from the property given by the support substrate alone (see Non-patent Document 1). One typical bonded substrate is represented by an SOI (Silicon On Insulator) substrate. The SOI substrate generally employs a polished wafer (PW) of silicon that is provided as a support substrate in the SOI substrate.

On the other hand, in the circumstances where the demand for the higher integration and multi-functionality of an LSI to be constructed on the silicon substrate is getting stricter, a delayed signal over a wired line has become a critical problem. The LSI according to the prior art includes an integrated electric circuit element that is stacked on a top layer of the silicon wafer (at a depth of some ten µm from the top surface) having a thickness of 500-800 µm.

As one solution to address this problem, an SOI substrate has been used recently. The SOI substrate has a configuration comprising an active layer in which a device is formed and a support substrate which is supporting the active layer with an embedded silicon oxide film having a thickness of some ten to some hundred nm which is interposed between the active layer and the support substrate.

In this type of SOI substrate, respective devices are separated completely from each other by the intervening embedded silicon oxide film. This may facilitate the higher integration of devices, including the possible multi-functionality, that could be provided in a three-dimensional configuration, thereby allowing for a high-speed operation as well as reduced errors in software and thus providing higher reliability and also suppressing a power consumption.

[Non-patent Document 1]
Semiconductor Wafer Bonding, Q. Y. Tong and U. Gosele, 1999, John Wiley & Son The SOI substrate typically has the active layer of thin film in a ranger of some ten Å (Angstrom) to 20 µm thick. Specifically, the smart cut method (Patent Document 1, 2) is known as one of the methods for fabricating the SOI substrate having the active layer of a thickness not greater than some µm. This defines such a method in which a light element, such as hydrogen, is implanted into a wafer prepared for the active layer and then any undesired portion of the wafer for the active layer is cleaved and separated at the site of implantation therein. More specifically, in this method, by using a portion of a silicon oxide film as an embedded silicon oxide film, the active layer wafer and the support substrate wafer are bonded together and thus produced bonded wafer is subject to a heat treatment, and then the active layer is cleaved and separated at a site of implantation of the hydrogen ions thus to successfully fabricate the SOI substrate having the active layer of thin film.

Besides, the active layer that has been just defined by the cleavage has good uniformity in film thickness from the view point of macro surface, because a film thickness thereof has been controlled by the energy from the hydrogen implantation. In the viewpoint of micro surface, however, roughness of the top surface of the active layer is quite significant. In order to reduce the roughness of the active layer surface after the cleavage process, the CMP (Chemical Mechanical Polishing) utilizing a chemical action and a mechanical action at the same time is applied to the active layer surface (Non-patent Document 2). Only this CMP process is so far effective to obtain the active layer surface that is comparable in roughness to the typical polished wafer.

Further, since the surface portion to be cleaved is defined inside a damaged layer formed by the hydrogen ion implantation, a certain depth of damaged layer could reside in the active layer surface after the cleaving process. The damage layer in the active layer surface would be an obstacle in forming the device and accordingly needs to be removed. This damaged layer emerges across a film thickness exceeding a certain value (on the order of 1000 Å in a practical condition) without any exception because it is introduced when the hydrogen ions having been implanted into the substrate are decelerated. For the purpose of preparing the active layer film for a target thickness in addition to removing the damaged layer of interest, a hydrogen annealing for providing a heat treatment in a reducing atmosphere containing hydrogen gas and an oxide film removal for removing an oxide film that has been once formed over the active layer are carried out in combination with and in addition to the CMP process (Patent Document 3).

[Patent Document 1]
U.S. Pat. No. 5,374,564, Specification
[Patent Document 2]
U.S. Pat. No. 6,020,252, Specification
[Non-patent Document 2]
IEICE Trans, Electron, Vol., E80C, No. 3, Page 358, 1997
[Patent Document 3]
Japanese Patent Laid-open Publication No. 2000-124092

However, there have been the following defects in association with the manufacturing method of the SOI according to the above-described prior art bonding methods.

Among those, there has been a fear that the film thickness distribution in the active layer could be worse upon applying the chemical mechanical polishing to the surface of the active layer by using a polishing apparatus. This is because the polishing process provided by the polishing apparatus is carried out in such a condition where the surface of the active layer of the SOI substrate is pressed against a polishing cloth spread over a polishing platen during the polishing while the SOI substrate being held on a polishing head, and consequently a polishing drop tends to be formed in a peripheral region of the wafer. Since this tendency could be more critical as the thickness to be removed in the CMP increases, there has been a limitation in achieving the preparation of the film thickness of the active layer only by the CMP.

Especially, when the active layer thickness is made as thin as 200 nm or lower, there has been observed another problem that the peel-off of the active layer occurs during the CMP process due to a micro void existing in a bonding interface. This micro void is derived from a micro concavity and convexity defined in the surfaces of the wafers to be bonded and it is believed that this kind of micro void could not be annihilated by the commonly applied heat treatment for bonding (as will be described later), differently from other micro voids on the mm order that are observed in the X-ray topography and/or in the supersonic method.

Besides, when applying the hydrogen annealing to the surface of the active layer, a high temperature annealing is applied, for example, in the hydrogen gas atmosphere at 1200° C. for one hour. This has made the process more complicated and led to higher cost. In addition, when such a large-sized wafer that has a diameter of 300 mm is subject to the hydrogen annealing, a single wafer processing method has been commonly practiced and this has led to lower throughput.

Further, when a process for reducing a roughness of the surface of the active layer is provided by the oxide film removal, for example, the bonded substrate is introduced into a thermal oxidation processing furnace where the bonded substrate is heat treated in an oxidizing gas atmosphere to thereby achieve the thermal oxidation of the substrate including the damaged portion in the surface of the active layer, forming resultantly the silicon oxide film. Then, the bonded substrate is cleaned with a HF cleaning fluid, so that the damaged portion in the surface of the active layer can be removed together with the silicon oxide film. According to the instant oxide film removal method, the entire procedure has been made complicated as described above and so a long processing time has been required. Further disadvantageously, it has likely been to lead to cost increase. Furthermore, since the heat treatment is involved, there has been a possibility that metal contamination could be induced in the active layer.

In the light of the above fact, the inventors of the present invention have made an enthusiastic research and found that if a solution having an etching effect is used to perform the micro-etching in a range of 1 nm to 1 μm on the surface of the active layer after the cleaving process, the active layer having a surface of uniform film thickness and of reduced roughness could be obtained and further advantageously that the process for reducing the surface roughness as described above could be simplified and associatively the processing cost could be reduced.

Furthermore, since this process employs the wet etching using the solution as described above, it has been made possible to employ the batch processing. Consequently, the process time could be shortened and the throughput could be increased. This wet etching is associated with a further advantage that the damage would not be introduced or damage, if any, could be removed. This profitably works to provide a great effect especially in that if the thickness of the active layer is made as thin as 200 nm or thinner, the peel-off of the active layer during the CMP resultant from the micro voids existing in the bonding interface can be prevented. The inventors of the present invention has completed the present invention by further finding that there would be almost no fear that the metal contamination is induced in the active layer since the wet etching no more involves the heat treatment.

Although some process using a chemical solution for the purpose of cleaning is associated with the etching, the present invention can be distinguished from the typical cleaning process in that the present invention takes advantage of the etching effect in a positive manner, where an adequate etching time is set so as to provide a good control of the thickness of active layer.

An object of the present invention is to provide a bonded substrate and a manufacturing method thereof, in which such an active layer that has a uniform thickness across an entire surface and a reduced surface roughness can be obtained, wherein a process for reducing the surface roughness can be simplified and resultantly a cost required for that process can be reduced, and the batch processing is made feasible, thereby shortening a process time and increasing throughput, and further favorably there is almost no fear of peel-off of the active layer as well as no fear of metal contamination in the process.

SUMMERY OF THE INVENTION

A first invention provides a bonded substrate fabricated to have its final active layer thickness of 200 nm or lower by performing an etching process on a surface of an active layer formed over a support substrate by cleaving off a portion of an active layer wafer, for the purpose of controlling the thickness of said active layer, said etching process carried out by using a solution having an etching effect so as to achieve the etching by a range of 1 nm to 1 μm.

In the manufacturing method of an SOI wafer in accordance with above-described smart cut method, ions of a light element, such as hydrogen, are implanted from a surface of a wafer for active layer (also referred to as an active layer wafer for simplicity) having a silicon oxide film formed thereon, and the active layer wafer and a wafer for support substrate (also referred to as a support substrate wafer for simplicity) are bonded together at a room temperature while using said ion-implanted surface as a bonding surface for the active layer wafer, and then thus fabricated bonded substrate is heat treated at 400° C. or higher. At this stage, the active layer wafer is cleaved at its region where the hydrogen ions have been implanted, to thereby fabricate the SOI substrate having the active layer. After that, the bonded substrate is further heat treated at 1000° C. or higher temperature in order to enhance a bonding strength.

The active layer wafer and the support substrate wafer may employ a single crystal silicon wafer, for example. Further, the single crystal silicon wafer with a single crystal film of Si, SiGe, SiC or the like, which has been grown epitaxially over the silicon wafer, may be employed.

This invention can work effectively in the fabrication of the SOI substrate having the active layer not thicker than 200 nm. Besides, the thickness of the embedded oxide film is in a range of some ten nm to some hundred nm, for example.

A preferred etching amount is defined by 5 nm to 500 nm. The etching amount less than 1 nm is too small to obtain any etching effect. On the other hand, the etching amount over 1 μm is too large, which makes it difficult to control a film thickness of the active layer.

As for the solution having an etching effect, for example, a SC-1 (Standard Cleaning 1) cleaning fluid may be employed which is used typically in the RCA method. Other etchant, including an acid etchant such as a mixed acid of HF/HNO$_3$ and an alkaline etchant such as KOH, NaOH, may be employed.

A second invention provides a manufacturing method of a bonded substrate having its final active layer thickness of 200 nm or lower by performing an etching process on a surface of an active layer formed over a support substrate by cleaving off a portion of an active layer wafer, for the purpose of controlling the thickness of said active layer, said etching process carried out by using a solution having an etching effect so as to achieve the etching by a range of 1 nm to 1 μm.

An etching bath is filled with the above-described etchant, and the bonded substrate is dipped in this etchant for an adequate time period while maintaining the temperature of the etchant and the like under the managed condition, to thereby control the thickness of the active layer.

A third invention provides a manufacturing method of a bonded substrate in accordance with the second invention, in which an etching rate in said etching process is not greater than 100 nm/min.

A preferred etching rate is in a range of 0.1 nm/min to 10 nm/min. The etching rate exceeding 100 nm/min may cause disadvantageously a reduced process margin for a correct film thickness control.

A fourth invention provides a manufacturing method of a bonded substrate in accordance with the second invention, in which said solution having an etching effect is a solution of pH 9 or higher containing alkaline chemicals and an oxidizer.

The alkaline chemicals may employ an aqueous solution of ammonia, for example. Other solutions, including an aqueous solution of sodium hydrate, an aqueous solution of calcium hydrate and the like, may be used. Besides, the oxidizer may employ an aqueous solution of hydrogen peroxide. Other solutions, such as an aqueous solution of ozone, may be used.

A preferred pH value of this solution is between pH 9 to pH 13. The pH level lower than pH9 can't provide a sufficient etching ability as the alkali, but the pH level over pH13 may cause a problem that the etching rate could be too high.

A fifth invention provides a manufacturing method of a bonded substrate in accordance with the third invention, in which said solution having an etching effect is a solution of pH 9 or higher containing alkaline chemicals and an oxidizer.

A sixth invention provides a manufacturing method of a bonded substrate in accordance with the second invention, in which said solution having an etching effect is a solution of pH 9 or higher containing an aqueous solution of ammonia and an aqueous solution of hydrogen peroxide.

This method uses the aqueous solution of ammonia as the alkaline chemicals and the aqueous solution of hydrogen peroxide as the oxidizer.

The mixed solution of the aqueous solution of ammonia and the aqueous solution of hydrogen peroxide may include the SC-1 cleaning fluid, for example. The compounding ratio by volume of the components in the SC-1 cleaning fluid is typically represented by 1:x:y (x=1 to 2, y=5 to 100) for the aqueous ammonia:the aqueous hydrogen peroxide:water.

The fluid temperature of the SC-1 cleaning fluid is preferably in a range of 30° C. to 90° C. The temperature below 10° C. can't provide a sufficient etching ability, but the temperature over 95° C. causes a rapid evaporation of the aqueous ammonia and makes it difficult to control the composition.

A seventh invention provides a manufacturing method of a bonded substrate in accordance with the third invention, in which said solution having an etching effect is a solution of pH 9 or higher containing an aqueous solution of ammonia and an aqueous solution of hydrogen peroxide.

An eighth invention provides a manufacturing method of a bonded substrate in accordance with the second invention, in which after said etching process, a thickness of said active layer is measured and based on said obtained measurement data, said etching process is repeated until said thickness of the active layer across its entire area comes near to a predetermined value of thickness (a target thickness).

As for a device for measuring the thickness of the active layer, for example, a spectro-ellipsometer may be employed which measures the thickness of the active layer by entering a polarized light onto a surface of the active layer and measuring a change in a polarized condition of a reflected light.

The measurement of the thickness of the active layer may be performed at each time of the etching applied to the surface of the active layer. Alternatively, the film thickness may be measured after a predetermined times of etching has been repeated.

A ninth invention provides a manufacturing method of a bonded substrate in accordance with the third invention, in which after said etching process, a thickness of said active layer is measured and based on said obtained measurement data, said etching process is repeated until said thickness of the active layer across its entire area comes near to a predetermined value of thickness (a target thickness).

A tenth invention provides a manufacturing method of a bonded substrate in accordance with the fourth invention, in which after said etching process, a thickness of said active layer is measured and based on said obtained measurement data, said etching process is repeated until said thickness of the active layer across its entire area comes near to a predetermined value of thickness (a target thickness).

An eleventh invention provides a manufacturing method of a bonded substrate in accordance with the fifth invention, in which after said etching process, a thickness of said active layer is measured and based on said obtained measurement data, said etching process is repeated until said thickness of the active layer across its entire area comes near to a predetermined value of thickness (a target thickness).

A twelfth invention provides a manufacturing method of a bonded substrate in accordance with the sixth invention, in which after said etching process, a thickness of said active layer is measured and based on said obtained measurement data, said etching process is repeated until said thickness of the active layer across its entire area comes near to a predetermined value of thickness (a target thickness).

A thirteenth invention provides a manufacturing method of a bonded substrate in accordance with the seventh invention, in which after said etching process, a thickness of said active layer is measured and based on said obtained measurement data, said etching process is repeated until said thickness of the active layer across its entire area comes near to a predetermined value of thickness (a target thickness).

A fourteenth invention provides a manufacturing method of a bonded substrate in accordance with any one of the second to the thirteenth inventions, in which one of following steps is performed on said active layer surface of said bonded substrate before said etching process, said steps including: (1) a step of chemical mechanical polishing process taking advantage of a chemical effect and a mechanical effect at the same time; (2) a step of hydrogen annealing process for performing a heat treatment in a reducing atmosphere containing hydrogen; and (3) a step of forming a silicon oxide film over said active layer and then removing said silicon oxide film along with a damaged portion of said active layer, which has been created in said cleaving process.

A fifteenth invention provides a manufacturing method of a bonded substrate in accordance with any one of the second to the thirteenth inventions, in which one of following steps is performed on said active layer surface of the bonded substrate after said etching process, said steps including: (1) a step of chemical mechanical polishing process taking advantage of a chemical effect and a mechanical effect at the same time; (2) a step of hydrogen annealing process for performing a heat treatment in a reducing atmosphere containing hydrogen; and (3) a step of forming a silicon oxide film over said active layer and then removing said silicon oxide film along with a damaged portion of said active layer, which has been created in said cleaving process.

A sixteenth invention provides a manufacturing method of a bonded substrate in accordance with any one of the second to the thirteenth inventions, in which one of following steps is performed on said active layer surface of the bonded substrate after and before said etching process, said steps including: (1) a step of chemical mechanical polishing process taking advantage of a chemical effect and a mechanical effect at the same time; (2) a step of hydrogen annealing process for performing a heat treatment in a reducing atmosphere containing hydrogen; and (3) a step of forming a silicon oxide film over said active layer and then removing said silicon oxide film along with a damaged portion of said active layer, which has been created in said cleaving process (1) The polishing apparatus used for the CMP process is not limited. Either of the single wafer processing or the batch processing may be used. Either of a single side polishing apparatus for polishing only one side of a semiconductor wafer or a double side polishing apparatus for polishing both front and back surfaces of a semiconductor wafer at the same time may be used.

Further, the single side polishing apparatus of waxless type may be used, which comprises a polishing platen and a polishing head disposed opposite to said polishing platen and in which a semiconductor wafer is chucked with water on a surface of the polishing head opposite to the polishing platen via a backing pad.

A polishing cloth may include a continuous expanded pad of suede type, for example. Further, the polishing cloth of non-woven porous fabric type made from polyester felt impregnated with polyurethane may be employable. Further, the polishing cloth of expanded urethane type made of slices of the expanded urethane block may be used, as well.

The polishing agent may employ a slurry containing loose abrasive grains such as colloidal silica (silica sol) and fumed silica, for example. Further, the slurry of ceria type using cerium oxide may also be employable. Alternatively, a fluid containing no abrasive grains may be used to perform so-called no-abrasive grain polishing. Yet further, the polishing cloth of bonded abrasive grain type may be employed without using any polishing agent.

(2) In the hydrogen annealing, an annealing apparatus is used to provide a heat treatment in the 100% hydrogen atmosphere at a temperature in a range of 1000° C. to 1350° C. for ten minutes to two hours. This allows the surface of the active layer to be fused and thus fluidized to create the surface of low roughness. In addition, the defect from the precipitation of oxygen in the active layer can be reduced and thus the quality of active layer can be improved.

(3) The oxide film removal referred here in represents the technology used to remove the damage region formed in the wafer surface layer, which is commonly referred to as the sacrificial oxidation. Specifically, the SOI substrate is inserted into the thermal oxidation treatment furnace, where the SOI substrate is heat-treated in the atmosphere of oxidizing gas at a temperature in a range of 800° C. to 1350° C. for ten minutes to 50 hours to thereby form the silicon oxide film having a thickness in a range of 2 nm to 2.25 μm over the top surface of the active layer including the damaged portion emerging upon the hydrogen ion implantation. After that, the silicon oxide film is fused to be lost by bringing the top surface of the active layer into contact with the HF cleaning fluid by, for example, an immersion process. During this process, the top surface portion of the active layer, which has been roughened during the cleaving process, can be removed together with the silicon oxide film.

Respective steps defined in (1) through (3) may be performed individually, for example, after the etching process. Alternatively, any two of those steps from (1) through (3) may be selectively applied. Yet further, all of the steps from (1) through (3) may be applied. Specifically, the process may follow a particular sequence, including, for example: (a) etching→CMP→oxide film removal (silicon oxide film thickness not greater than 300 nm); (b) etching→CMP→etching; (c) etching→hydrogen annealing; (d) oxide film removal→CMP→etching; (e) oxide film removal→etching; (f) CMP→dry etching→etching; and (g) CMP→etching.

According to the bonded substrate in accordance with the first invention and the manufacturing method of a bonded substrate in accordance with the second invention, after the active layer having been formed by cleaving off a portion of the active layer wafer, the surface of the active layer is etched only by the thickness of 1 nm to 1 μm with the solution having the etching effect. AS a result, the final active layer thickness will be no greater than 20 nm. The final active layer means an active layer at the stage where the etching, polishing and the like have been previously done and then the final cleaning process has been finished. Owing to these processes, the film thickness of the active layer after the cleavage is made uniform over the entire surface area thereof and also these can advantageously simplify the process for achieving the lower surface roughness and accordingly reduce the cost therefore. Further advantageously, due to the fact that this etching is the wet etching, such as dipping in the etchant, the batch processing for handling a plurality of wafers all at once may be employable, thereby allowing the process time to be shorter and thus the throughput to be increased. Furthermore, differently from the conventionally practiced hydrogen annealing, oxide film removal and dry etching, the process of the present invention is carried out without using the heat treatment, and so there could be almost no fear that any metal contamination is induced in the active layer.

Especially, according to the manufacturing method of a bonded substrate in accordance with the eighth to the thirteenth inventions, after the etching process, the thickness of the active layer is measured, and based on the measured thickness, an amount of subsequent etching can be determined within the range of 1 nm to 1 μm so as to repeat the etching process. This advantageously allows the uniformity in thickness to be achieved over the entire surface area of the active layer in a stable manner.

According to the manufacturing method of a bonded substrate in accordance with the fourteenth to the sixteenth inventions, since at least one of the steps of: (1) chemical mechanical polishing; (2) hydrogen annealing; and (3) oxide film removal, may be applied to the surface of the active layer of the bonded substrate before and/or after the etching process, the uniformity in film thickness of the active layer after the cleavage can be enhanced and the roughness of the surface of the active layer can be reduced.

DESCRIPTION OF THE PREFERRED EMBODIMENTS

The present invention will now be described with reference to the attached drawings.

Figure 1:
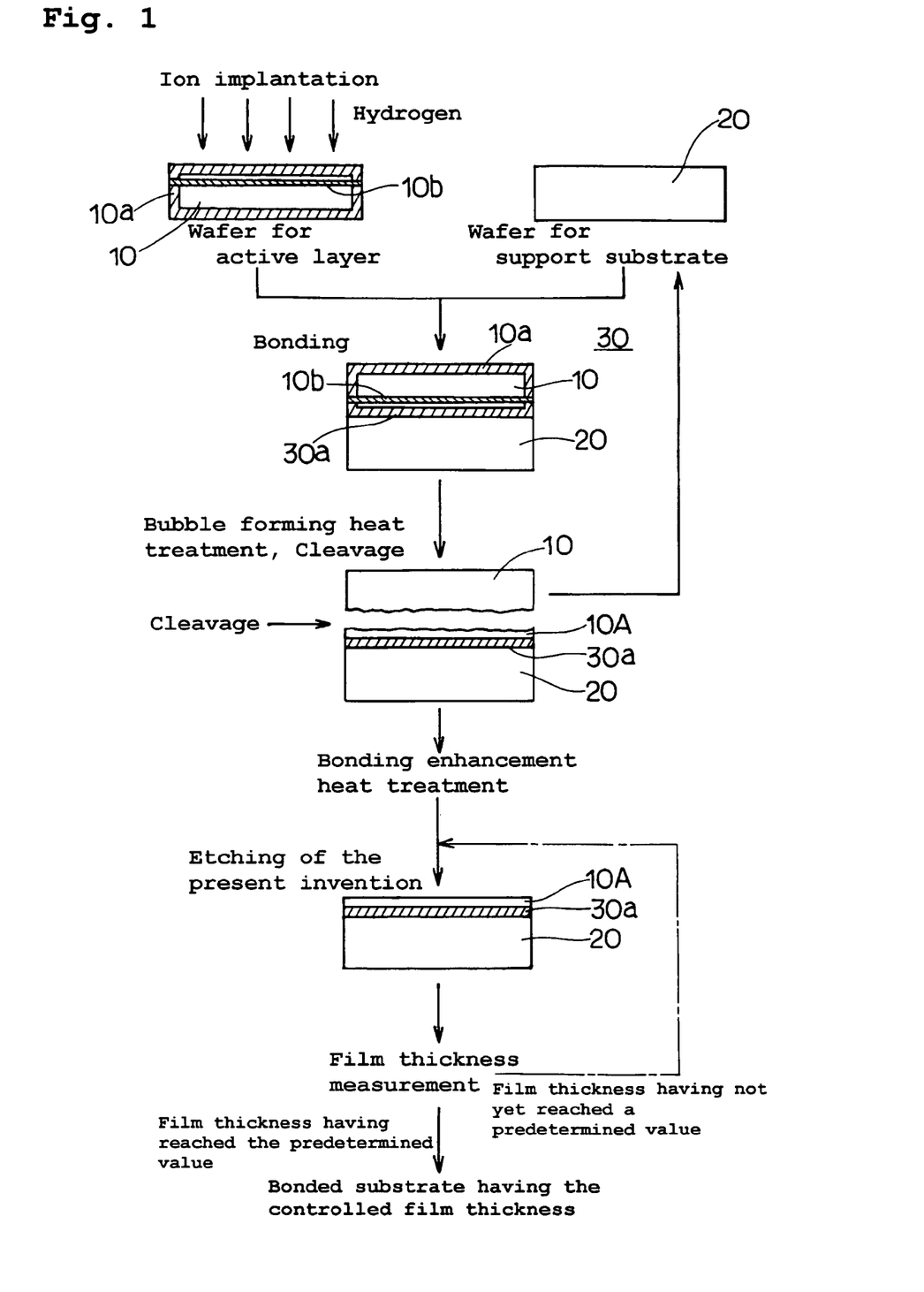
FIG. 1 is a flow chart showing a manufacturing method of a bonded substrate according to a first embodiment of the present invention.

FIG. 1 is a flow chart showing a manufacturing method of a bonded substrate (SOI substrate) according to a first embodiment of the present invention.

As shown in FIG. 1, firstly a wafer for active layer (silicon wafer) 10 is prepared by applying to a single-crystal silicon ingot that has been pulled up by the CZ method, each of the processes including slicing, beveling, lapping, etching and polishing so as to form it into a wafer having a thickness of 725 μm and a diameter of 200 mm (8 inches) with one-side or both-sides thereof mirror finished. On the other hand, a wafer for support substrate (silicon wafer) 20 is prepared by using the same manufacturing method as that used for the wafer for active layer 10 so as to be formed into a wafer having the same thickness and the same diameter as the wafer for active layer and a mirror finished surface. The active layer wafer 10 from those two is introduced into a thermal oxidation furnace, where it is treated with the thermal oxidation at 900° C. while allowing a predetermined amount of oxygen gas to flow into the furnace. This produces an insulating silicon oxide film 10a of 2000 Å (angstrom) thick extending over an entire exposed surface of the active layer wafer 10. It is to be noted that on the active layer wafer 10, an epitaxial layer may be formed instead of the above-mentioned silicon oxide film 10a in order to differentiate its property from that of the support substrate wafer.

A medium current ion implanter is used to implant hydrogen ions into the active layer wafer 10 from a wafer surface side thereof at a density of $5.0 \times 10^{16}$ atmos/cm$^2$. A depth of implantation is about 3450 Å (angstrom) and an accelerating voltage is 28.5 keV. This can produce a hydrogen ion implanted layer (implanted and damaged layer) 10b on top of the active layer wafer 10.

After that, the active layer wafer 10 and the support substrate wafer 20 are bonded together (at a room temperature to 50° C.) with the surface of the active layer wafer 10 and the mirror polished surface of the support substrate wafer 20 used as bonding surfaces so as to form a bonded wafer 30. As a result of this bonding, the portion of the silicon oxide film 10a interposed between the active layer wafer 10 and the support substrate wafer 20 is formed into an embedded silicon oxide film 30a. A thickness of the embedded silicon oxide film 30a is 2000 A.

It is to be noted that the support substrate wafer 20 may also be firstly treated so that its surface is oxidized and then bonded together with the active layer wafer 10.

In next step, the bonded wafer 30 is introduced into a thermal oxidation furnace for bonding, where it experiences a heat treatment for forming bubbles under the oxygen gas atmosphere at 500° C. for one hour. As a result, hydrogen atoms have gathered intensively inside the active layer wafer 10. This causes a large number of regions of high density hydrogen bubble to emerge inside the active layer wafer 10, and the unnecessary portion of the active layer wafer 10 is cleaved away at those regions. In more specific, the hydrogen implanted into the silicon produces a crystal defect and a micro cavity, and upon annealing at 500° C. adjacent micro cavities are coupled to be large in size. Then, the cleavage occurs at a depth of the highest hydrogen concentration. Consequently, the active layer wafer 10 is thinned and turned to be the active layer 10a in the form of thin film having the thickness on the order of 2 μm.

It is to be noted that the unnecessary portion of the active layer wafer 10 that has been cleaved away can be reused as the support substrate wafer 20.

Subsequently, the heat treatment is applied to the bonded wafer 30 at 1100° C. for two hours. This enhances the bonding strength between the active layer wafer 10 and the support substrate wafer 20.

After that, the etching is performed by a small amount over the exposed portion of the bonded wafer 30, from which the unnecessary portion has been already removed, by using a solution having an etching effect. In this illustrated embodiment, SC-1 solution is employed as an etchant. The SC-1 solution is a solution containing an aqueous ammonia as an alkaline chemical and an aqueous hydrogen peroxide as an oxidant. A composition of the SC-1 solution herein has employed a compounding ratio by volume of 1:2:10 for the aqueous ammonia: the aqueous hydrogen peroxide:water.

In addition to the above description, a result of an experiment will be presented which was conducted in such a manner that a plurality of 8-inch SOI wafers were loaded to a wafer cassette for 25-pieces, though not shown, and the cassette was dipped in the SC-1 solution (at 85° C.) having the above composition within a cleaning bath. The etching time was 90 minutes. The etched amount determined through the measuring (at 81 points in a plane with an Edge Exclusion of 5 mm) of the film thickness before and after the etching process with a film thickness measuring device, which will be described later, was 922 Å (angstrom) in in-plane average and 44 Å in in-plane Max-Min for a slot No. 2 of the wafer cassette; 936 Å in in-plane average and 51 Å in in-plane Max-Min for a slot No. 13; and 952 Å in in-plane average and 50 Å in in-plane Max-Min for a slot No. 24. The term "in-plane (in a wafer surface)" used herein represents an entire area of the wafer surface defined in the inner side with respect to said width of Edge Exclusion from the outer circumference. Further, the term "in-plane Max-Min" refers to a difference between the maximum thickness and the minimum thickness in all of the measuring points distributed evenly over the entire area of the wafer surface defined in the inner side with respect to said width of Edge Exclusion from the outer circumference. As is obvious from the test result described above, the etching by using the SC-1 solution is a technique of high productivity and controllability for making the thin film, which is able to suppress a variation in respective values within the batch and/or the wafer plane to be small in spite of the large amount of etching. In this point of view, this solution is overwhelmingly advantageous over the CMP that has been typically practiced for making the bonded wafer thinner in the prior art. To give an example, the test that we had conducted by using the CMP, the prior art method, under the condition of the polishing pressure of 160 gf/cm$^2$, the polishing platen revolution speed of 50 rpm, the polishing head revolution speed of 50 rpm, the slurry flow rate of 0.3 L (liter)/min and the polishing time of three minutes by the CMP indicated such high values as the resultant active layer in-plane average film thickness of 1103 Å and the resultant active layer in-plane Max-Min film thickness of 326 Å. This result is teaching that it is effective that the amount of the active layer to be removed by the CMP is minimized to a range required for reducing the surface roughness and the etching method as disclosed in the present invention is primarily practiced to control the film thickness.

Next, the film thickness of the active layer 10A after the etching of the bonded wafer 30 is measured. In this stage, a spectro-ellipsometer (product name: SOPRA-MOS-ES4 G) is used. Then, the data from the measurement is evaluated, in which if the data shows that the film thickness of the active layer 10A has reached the predetermined value (uniform film thickness over the entire surface area), it indicates that the SOI substrate has been successfully fabricated. Later, thus obtained SOI substrate is typically, after various kinds of measurement and evaluation, further processed in the cleaning work for finishing in order to remove any contamination or particles from the measuring device, and predetermined pieces of finished wafer are loaded to a wafer case, which is packed and shipped to a device manufacturer. If the cleaning fluid having an etching effect is used in the cleaning work, it is required to keep controlling the active layer film thickness before the respective measurements and evaluations by taking the amount of active layer to be removed in this final cleaning work into account. Further, for such a wafer that has been determined whose film thickness in the active layer 10A has not yet reached said predetermined value, the SC-1 etching and the film thickness measurement is repeatedly performed until the predetermined value of the film thickness of the active layer 10A is finally achieved.

Since in this way, the surface of the active layer 10A is etched by using the SC-1 cleaning fluid after the active layer 10A having been formed by cleaving off a portion of the active layer wafer 10, it becomes possible for the active layer 10A after the cleavage to be formed into such one of uniform film thickness and of reduced surface roughness over its entire surface area. In addition, the process for reducing the surface roughness in these stages can be simplified and thus the processing cost associated therewith can be reduced. Besides, the etching performed herein is the wet etching by using the SC-1 cleaning fluid. This allows the etching in batch processing to be applicable, in which a large number of wafers can be cleaned all at once by using the above-described cleaning bath, and thus the process time to be shorter and accordingly the throughput to be higher. Further advantageously, since the manufacturing method of the bonded substrate no more involves the heat treatment, there would be almost no fear that the metal contamination is induced in the active layer 10A.

Further, since the thickness of the active layer 10A is measured after the etching, and then based on the measurement data, the subsequent etching amount of the active layer 10A is determined, therefore it is ensured that the thickness of the active layer 10A can be made uniform across the entire surface area thereof. Further, since the SC-1 cleaning fluid is employed as the solution having the etching effect, the existing cleaning technology for the SC-1, as it is, can be used so as to provide an easy control to obtain a desired etching amount.

A second embodiment of the present invention will now be described with reference to FIG. 2.

Figure 2:
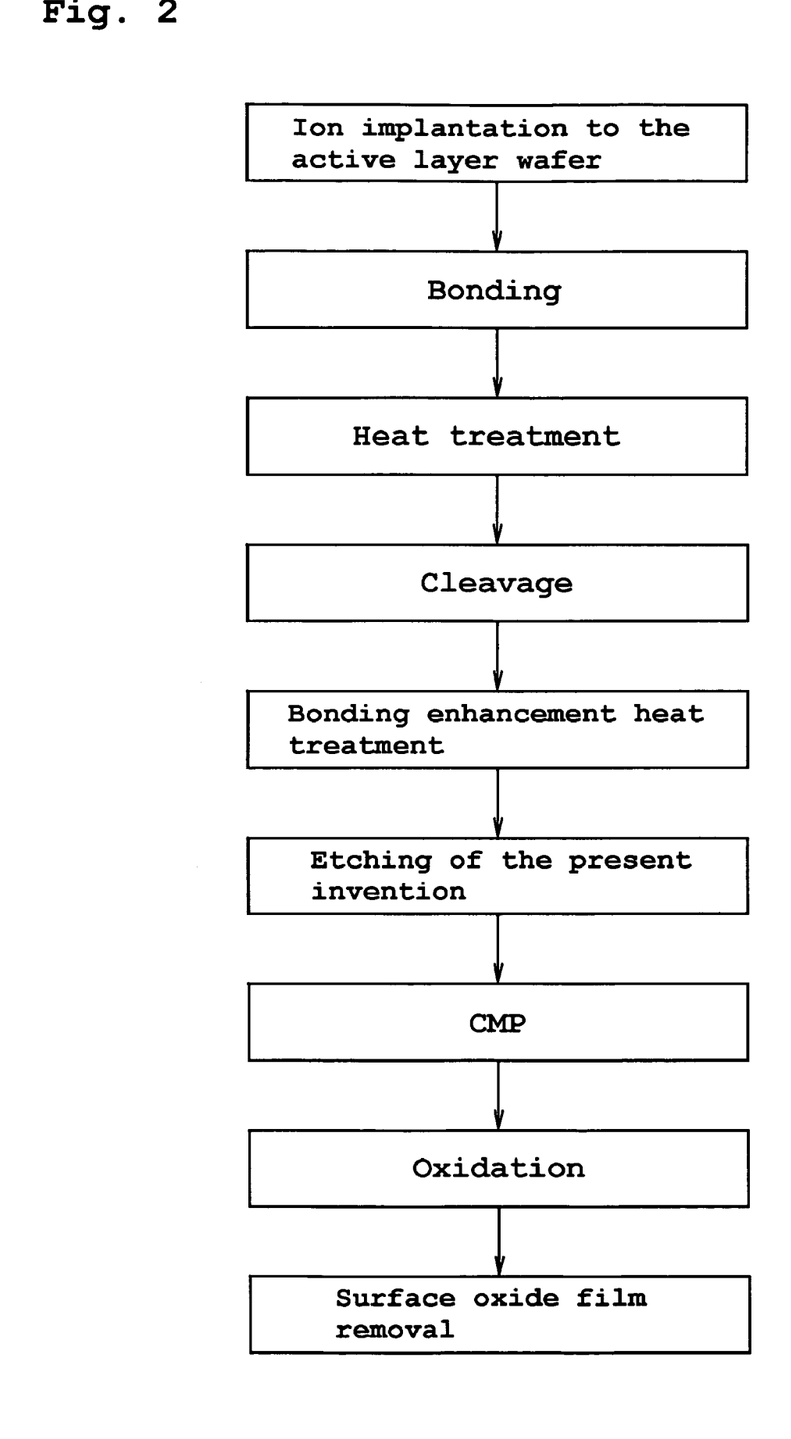
FIG. 2 is a flow chart showing a manufacturing method of a bonded substrate according to a second embodiment of the present invention.

FIG. 2 is a flow chart showing a manufacturing method of a bonded substrate (SOI substrate) according to the second embodiment.

In the second embodiment, following to the same procedure as in the first embodiment, the process begins with the hydrogen ion implantation to the active layer wafer, then goes through the bonding of the active layer wafer with the support substrate wafer, the cleavage heat treatment for the bubble formation in the bonded wafer, the cleaving of the active layer wafer at its portion of the ion-implanted region, and the bonding heat treatment for enhancing the bonding strength of the bonded wafer, and finally provides the etching of the surface of the active layer by a predetermined amount by using the SC-1 cleaning fluid. This embodiment is specific in that subsequently the CMP process, the oxidation and the oxide film removal are sequentially applied to the surface of the active layer.

In this case, the surface roughness of the active layer immediately after the cleaving is 6.17 nm (Rms).

The etching by the SC-1 cleaning fluid described above is carried out in the same fluid composition as in the first embodiment for 135 minutes with the amount to be removed from the cleavage surface of the active layer of 166.2 nm.

The amount to be polished and removed from the active layer in the subsequent CMP is 17.8 nm. The roughness of the active layer surface is 3.21 nm (Rms). The condition for carrying out the CPM process is defined by the polishing pressure of 160 gf cm$^2$, the polishing platen revolution speed of 50 rpm, the polishing head revolution speed of 50 rpm (revolution in the same direction as the platen), the slurry flow rate of 0.3 liter/min, and the polishing time of one minute.

The condition for the subsequent oxidation is defined such that the oxidation of the bonded wafer is carried out in the atmosphere of dry $O_2$ at 1150° C. for three hours.

Further, in the step for removing the oxide film on its surface (dipping in the HF solution), the amount to be removed is 192.4 nm and the roughness of the active layer surface is to be 5.09 nm (Rms).

As described above, in the second embodiment, the roughness can be reduced on the cleavage surface of the active layer by applying the SC-1 etching to the cleavage surface of the active layer.

Thus, in this embodiment, since after having been etched by using the SC-1 cleaning fluid, the bonded wafer is subject to the respective steps of the CMP, the oxidation and the oxide film removing processes sequentially, the uniformity in the film thickness across the entire surface area of the active layer after the cleavage can be improved. Further, the roughness of the surface of the active layer can be reduced.

Other parts of the configuration, operation and effect of the second embodiment are within a presumable range from the first embodiment, and any detailed explanation is herein omitted.

Figure 3:
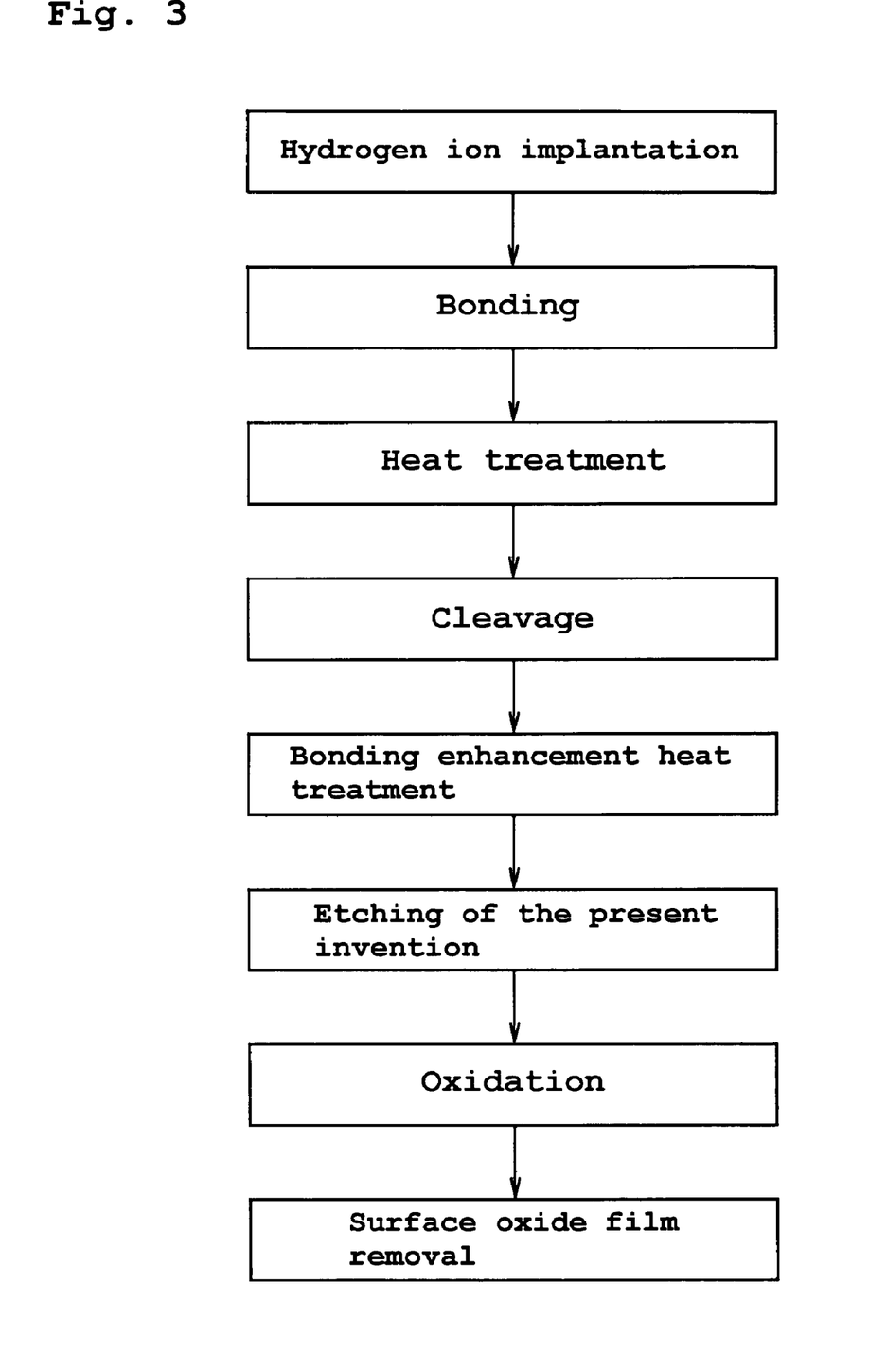
FIG. 3 is a flow chart showing a manufacturing method of a bonded substrate according to a third embodiment of the present invention.

A third embodiment of the present invention will now be described.

FIG. 3 is a flow chart showing a manufacturing method of a bonded substrate (SOI substrate) according to the third embodiment of the present invention.

In this embodiment, following to the same procedure as in the second embodiment, the process begins with the hydrogen ion implantation into the active layer wafer, then goes through the bonding of the active layer wafer with the support substrate wafer, the heat treatment for the bubble formation in the bonded wafer, the cleaving of the active layer wafer at its portion of the ion-implanted region, and the bonding heat treatment for enhancing the bonding strength of the bonded wafer, and finally provides the etching of the surface of the active layer by using the SC-1 cleaning fluid. This embodiment is specific in that subsequently the oxidation and the oxide film removal are sequentially applied to the surface of the active layer.

In this case, the surface roughness of the active layer immediately after the cleavage is 6.32 nm (Rms).

The etching by the SC-1 cleaning fluid described above is carried out in the same fluid composition as in the first embodiment for 135 minutes with the amount to be removed from the cleavage surface of the active layer of 166.5 nm. The surface roughness of the active layer is 5.09 nm (Rms).

The condition for the subsequent oxidation is defined such that the oxidation of the bonded wafer is carried out in the atmosphere of dry $O_2$ at 1150° C. for three hours.

Further, in the step for removing the oxide film on its surface (dipping in the HF solution), the amount of the surface oxide film to be removed is to be 195.7 nm and the roughness of the active layer surface is to be 2.07 nm (Rms).

As a result from the above-described procedure, the roughness of the cleavage surface of the active layer has been successfully reduced by applying the SC-1 etching to the cleavage surface of the active layer and providing a sacrificial oxidation onto the cleavage surface side of the active layer. That is, the combination of the sacrificial oxidation with the SC-1 etching enables the surface roughness of the active layer to be reduced without the need for carrying out the CMP.

Figure 4:
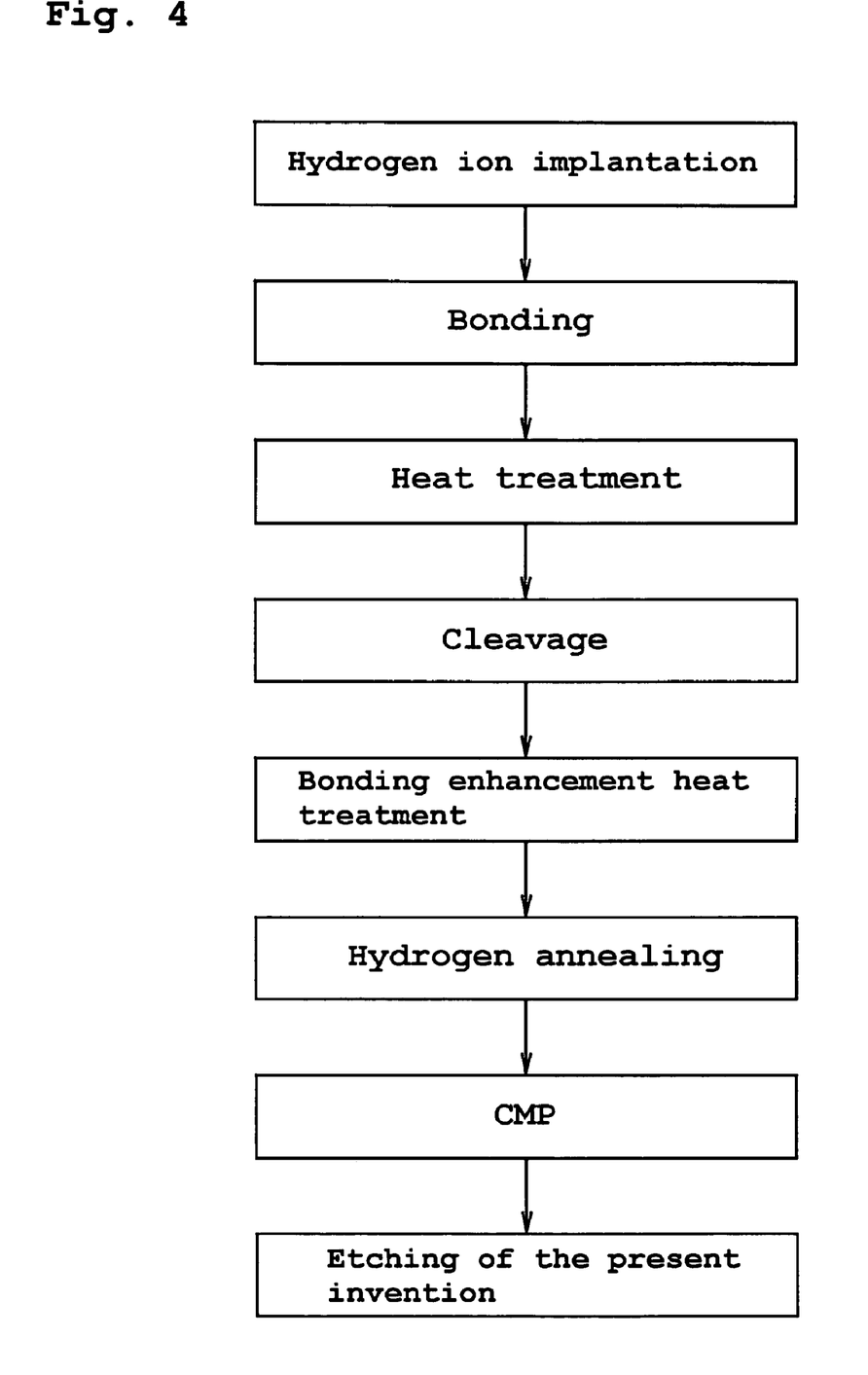
FIG. 4 is a flow chart showing a manufacturing method of a bonded substrate according to a fourth embodiment of the present invention.

FIG. 4 is a flow chart showing a manufacturing method of a bonded substrate (SOI substrate) according to a fourth embodiment of the present invention.

In this embodiment, following to the same procedure as in the first embodiment, the process begins with the hydrogen ion implantation into the active layer wafer, then goes through the bonding of the active layer wafer with the support substrate wafer, the heat treatment for the bubble formation in the bonded wafer, the bonding heat treatment for enhancing the bonding strength of the bonded wafer (those heat treatments are carried out serially), and the cleaving of the active layer wafer at its portion of the ion-implanted region, and finally provides the hydrogen annealing of the surface of the active layer. This embodiment is specific in that subsequently the CMP process and further the SC-1 etching are performed on the surface of the active layer.

In this case, the surface roughness of the active layer immediately after the cleavage is 6.17 nm (Rms).

The hydrogen annealing treatment is applied to the active layer at 1135° C. for one minute. The amount of the active layer to be removed by the hydrogen annealing is 6.8 nm.

The amount of the active layer to be polished and removed in the subsequent CMP process is 41.9 nm. The surface roughness of the active layer in this stage is 0.21 nm (Rms). Further, the condition for carrying out the CPM process is defined by the polishing pressure of 160 gf/cm$^2$, the polishing platen revolution speed of 50 rpm, the polishing head revolution speed of 50 rpm (revolution in the same direction as the platen), the slurry flow rate of 0.3 liter/min and the polishing time of one minute.

The SC-1 etching described above is carried in the same condition as in the first embodiment for 47 minutes with the amount of the active layer to be removed of 55.8 nm. The surface roughness of the active layer is 1.73 nm (Rms).

As described above, in the illustrated embodiment, the SC-1 etching is applied to the active layer after the surface roughness of the active layer in its cleavage surface having been improved by the short time processing of the hydrogen annealing and the CMP. Although there has been disadvantageously a fear in the CMP that the mechanical force exerts influence on the sites of micro void existing in the bonding interface of the bonded wafer to thereby induce the peeling-off of the active layer, this peeling-off can be avoided by the method of the present invention, in which the thinning of the active layer in the region proximal to the bonding interface is provided by the SC-1 etching.

Figure 5:
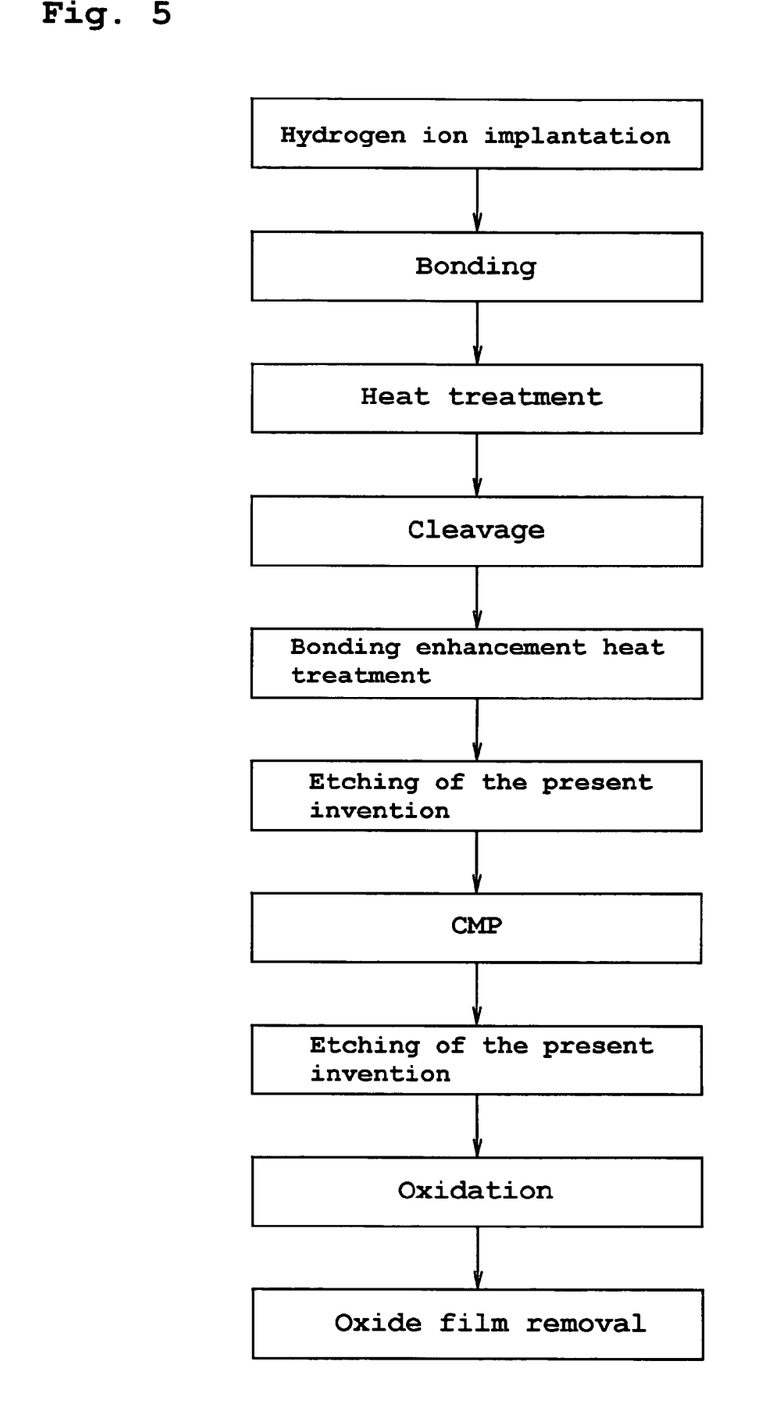
FIG. 5 is a flow chart showing a manufacturing method of a bonded substrate according to a fifth embodiment of the present invention.

FIG. 5 is a flow chart showing a manufacturing method of a bonded substrate (SOI substrate) according to a fifth embodiment of the present invention.

In this embodiment, following to the same procedure as in the first embodiment, the process begins with the hydrogen ion implantation into the active layer wafer, then goes through the bonding of the active layer wafer with the support substrate wafer, the heat treatment for the bubble formation in the bonded wafer and the bonding heat treatment for enhancing the bonding strength of the bonded wafer (those heat treatments may be carried out serially or separately), and the cleaving of the active layer wafer at its portion of the ion-implanted region, and finally applies the SC-1 etching to the surface of the active layer. This embodiment is specific in that subsequently the CMP process and additionally the second SC-1 etching are applied to the surface of the active layer, and then the oxidation of the active layer and the oxide film removal are performed.

In this case, the surface roughness of the active layer immediately after the cleavage is 6.37 nm (Rms).

The above-described SC-1 etching process is carried out for 135 minute. The amount of the active layer to be removed is 166.8 nm.

The amount of the active layer to be polished and removed in the subsequent CMP process is 27.3 nm. Further, the condition for carrying out the CPM process is defined by the polishing pressure of 160 gf/cm$^2$, the polishing platen revolution speed of 50 rpm, the polishing head revolution speed of 50 rpm (revolution in the same direction as the platen), the slurry flow rate of 0.3 liter/min and the polishing time of 1.5 minutes.

The SC-1 etching described above is carried in the same condition as in the first embodiment for 47 minutes with the amount of the active layer to be removed of 55.8 nm. The surface roughness of the active layer is 1.73 nm (Rms).

The condition of the subsequent oxidation process is defined such that the oxidation is carried out on the bonded wafer in the atmosphere of dry $O_2$ at 1150° C. for three hours.

Further, in the process for removing the surface oxide film thereof (dipping in the HF solution), the amount of the active layer to be removed is 135.4 nm and the surface roughness of the active layer is 1.00 nm (Rms).

As described above, in the illustrated embodiment, the roughness of the cleavage surface of the active layer has been successfully reduced by applying the SC-1 etching thereto. It is to be noted that the timing to apply the SC-1 etching is not limited to that after the active layer having been thinned.

There will now be presented a report on the result from the actual examination through comparison between the method by the present invention and the prior art method directed on the uniformity in film thickness and the surface roughness of the active layer after the surface roughness reducing process having been applied to the active layer after the cleavage. In Table 1, the SC-1 etching was conducted in accordance with the description provided with reference to the first embodiment. Further, the CMP and the oxide film removal were conducted in accordance with the description provided with reference to the second embodiment.

TABLE 1

| | Treatment to the active layer surface after cleavage | Evaluation of film thickness uniformity and surface roughness | |
|---|---|---|---|
| | | Film thickness uniformity | Surface roughness |
| Test example 1 | SC-1 | ◎ | — (depending significantly on the condition before treatment) |
| Test example 2 | SC-1→CMP→Oxide film removal (<300 nm) | ◎ | ◎ |

TABLE 1-continued

|  | Treatment to the active layer surface after cleavage | Evaluation of film thickness uniformity and surface roughness | |
|---|---|---|---|
|  |  | Film thickness uniformity | Surface roughness |
| Test example 3 | SC-1→CMP→SC-1 | ◎ | ◎ |
| Test example 4 | Oxide film removal→CMP→SC-1 | ◎ | ◎ |
| Test example 5 | CMP→SC-1 | ○ | ◎ |
| Comparative example 1 | CMP→Hydrogen annealing | ○ | ◎ |
| Comparative example 2 | CMP → Oxide film removal(>300 nm) | ○ | ◎ |
| Comparative example 3 | Oxide film removal→Hydrogen annealing | ○ | Δ |
| Comparative example 4 | Hydrogen annealing | ○ | Δ |

Explanatory note: ◎ denotes "Excellent", ○ "Good" and Δ "Not bad" in evaluation, respectively
Figures in ( ) denote the film thickness of the silicon oxide film (sacrificial oxide film).

As is obvious from Table 1, it has been proved that the method of the present invention (Test example 1 to 5) can provide better results in both of the uniformity in film thickness and the surface roughness over the prior art method (Comparative example 1 to 4).

According to the bonded substrate as defined in the first invention and a manufacturing method of a bonded substrate as defined in the second invention, since the surface of the active layer that has been formed by the cleavage of the active layer wafer is etched only by the thickness of 1 nm to 1 μm by using the solution having the etching effect so as to achieve the final thickness of the active layer equal to or less than 200 nm, therefore the active layer having the uniform thickness and the lower surface roughness over the entire surface area can be obtained, and the thinning process on the active layer after the cleavage can be simplified as well. As a result, the cost for this thinning process can be reduced.

Further, since this method uses the wet etching with the etching liquid, it is allowed to employ the batch processing in which a plurality of wafers can be processed all at once. Consequently, this can shorten the process time and increase the throughput as well. Furthermore, differently from the conventional method employing the hydrogen annealing and/or the oxide film removal processes, the method of the present invention uses the wet etching in conjunction with no heat treatment, and so there could be almost no fear that any metal contamination is induced in the active layer.

Especially, according to a manufacturing method of a bonded substrate as defined in the eighth invention, since the thickness of the active layer is measured after the etching, and based on the measurement data, the etching amount for the subsequent etching process is determined within a range of 1 nm to 1 μm, therefore the thickness of the active layer is ensured to be uniform over the entire surface area.

Furthermore, according to a manufacturing method of a bonded substrate as defined in the fourteenth invention, the uniformity in film thickness of the active layer after the cleavage can be enhanced over the entire surface area, and the roughness of the surface of the active layer can be also further reduced.

What is claimed is:

1. A manufacturing method of a bonded substrate having a final active layer thickness of 200 nm or less, comprising:
   a) providing a first silicon wafer as an active layer wafer and a second silicon wafer as a support substrate;
   b) forming silicon oxide film on a surface of said active layer wafer;
   c) implanting hydrogen ions into the active layer wafer to form a hydrogen ion implanted layer under the silicon oxide film;
   d) bonding the active layer wafer and the support substrate such that the silicon oxide film is interposed between the active layer wafer and the support substrate and forms a bonded substrate having an embedded silicon oxide film;
   e) heat treating the bonded substrate to form regions of high density hydrogen bubbles and cleaving away a portion of the active layer wafer at said regions whereby the non-cleaved active layer wafer of the bonded substrate becomes the active layer of the bonded substrate;
   f) heat treating the cleaved bonded substrate to enhance bonding strength between the active layer wafer and the support substrate; and
   g) etching a surface of the active layer of the bonded substrate to control the thickness of said active layer, said etching being carried out using a solution having an etching effect so as to etch in a range of 1 nm to 1 μm, said solution being a solution having pH 9 or higher and containing alkaline chemicals and an oxidizer.

2. A manufacturing method of a bonded substrate in accordance with claim 1, in which an etching rate in said etching is not greater than 100 nm/min.

3. A manufacturing method of a bonded substrate in accordance with claim 1, in which after said etching, a thickness of said active layer is measured and based on said obtained measurement data, said etching is repeated until said thickness of the active layer across its entire area comes near to a predetermined thickness of the final active layer.

4. A manufacturing method of a bonded substrate in accordance with claim 2, in which after said etching, a thickness of said active layer is measured and based on said obtained measurement data, said etching is repeated until said thickness of the active layer across its entire area comes near to a predetermined thickness of the final active layer.

5. A manufacturing method of a bonded substrate in accordance with claim 1, in which one of following steps is performed on said active layer of said bonded substrate before said etching, said steps including;
   (1) a step of chemical mechanical polishing taking advantage of a chemical effect and a mechanical effect at the same time;
   (2) a step of hydrogen treating for performing a heat treatment in a reducing atmosphere containing hydrogen; and
   (3) a step of forming a silicon oxide film over said active layer and then removing said silicon oxide film along with a damaged portion of said active layer, which has been created in said cleaving.

6. A manufacturing method of a bonded substrate in accordance with claim 1, in which one of following steps is performed on said active layer surface of said bonded substrate after said etching, said steps including:
   (1) a step of chemical mechanical polishing taking advantage of a chemical effect and a mechanical effect at the same time;
   (2) a step of hydrogen treating for performing a heat treatment in a reducing atmosphere containing hydrogen; and
   (3) a step of forming a silicon oxide film over said active layer and then removing said silicon oxide film along with a damaged portion of said active layer, which has been created in said cleaving.

* * * * *